(12) United States Patent
Russo et al.

(10) Patent No.: US 9,725,308 B2
(45) Date of Patent: Aug. 8, 2017

(54) OSCILLATION FREQUENCY MEASURING SYSTEM AND METHOD FOR A MEMS SENSOR

(71) Applicant: STMicroelectronics S.r.l., Agrate Brianza (IT)

(72) Inventors: Alfio Russo, Biancavilla (IT); Massimo Cataldo Mazzillo, Corato (IT); Ferenc Nagy, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 360 days.

(21) Appl. No.: 14/303,522

(22) Filed: Jun. 12, 2014

(65) Prior Publication Data

US 2015/0000402 A1   Jan. 1, 2015

(30) Foreign Application Priority Data

Jun. 28, 2013  (IT) .............................. TO2013A0538

(51) Int. Cl.
*G01H 9/00*  (2006.01)
*B81C 1/00*  (2006.01)
*G01H 3/06*  (2006.01)

(52) U.S. Cl.
CPC ............. *B81C 1/0015* (2013.01); *G01H 3/06* (2013.01); *G01H 9/00* (2013.01); *B81C 2203/075* (2013.01)

(58) Field of Classification Search
CPC .................................. G01H 3/06; G01H 9/00
USPC .......................................... 73/651, 653, 657
See application file for complete search history.

(56) References Cited

U.S. PATENT DOCUMENTS

| 5,445,008 | A  | * | 8/1995 | Wachter | ............... | G01N 29/036 |
|---|---|---|---|---|---|---|
|  |  |  |  |  |  | 422/88 |
| 6,422,077 | B1 |  | 7/2002 | Krauss et al. |  |  |
| 7,444,877 | B2 |  | 11/2008 | Li et al. |  |  |
| 7,521,257 | B2 | * | 4/2009 | Adams | .................. | G01Q 60/34 |
|  |  |  |  |  |  | 250/234 |
| 7,813,019 | B2 | * | 10/2010 | Hirata | .................... | G02B 26/10 |
|  |  |  |  |  |  | 359/199.3 |
| 2009/0184384 | A1 |  | 7/2009 | Sanfilippo et al. |  |  |

(Continued)

FOREIGN PATENT DOCUMENTS

EP         1 674 833 A2    6/2006

OTHER PUBLICATIONS

Barillaro et al., "Integrated porous-silicon light-emitting diodes: A fabrication process using graded doping profiles," *Applied Physics Letters* 78(26):4154-4156, Jun. 25, 2001.

(Continued)

*Primary Examiner* — John Chapman, Jr.
(74) *Attorney, Agent, or Firm* — Seed Intellectual Property Law Group LLP

(57) ABSTRACT

A MEMS sensor has at least a movable element designed to oscillate at an oscillation frequency, and an integrated measuring system coupled to the movable element to provide a measure of the oscillation frequency. The measuring system has a light source to emit a light beam towards the movable element and a light detector to receive the light beam reflected back from the movable element, including a semiconductor photodiode array. In particular, the light detector is an integrated photomultiplier having an array of single photon avalanche diodes.

20 Claims, 10 Drawing Sheets

(56) References Cited

U.S. PATENT DOCUMENTS

2011/0216315 A1* 9/2011 Uematsu .................. G01J 3/02
356/326
2013/0015331 A1* 1/2013 Birk .......................... G01J 3/36
250/208.2

OTHER PUBLICATIONS

Snyman et al., "Higher efficiency silicon CMOS light emitting devices (450nm-750nm) using current density and carrier injection techniques," Optoelectronic Integration on Silicon II, Proceedings of SPIE vol. 5730, pp. 59-72, 2005.

* cited by examiner

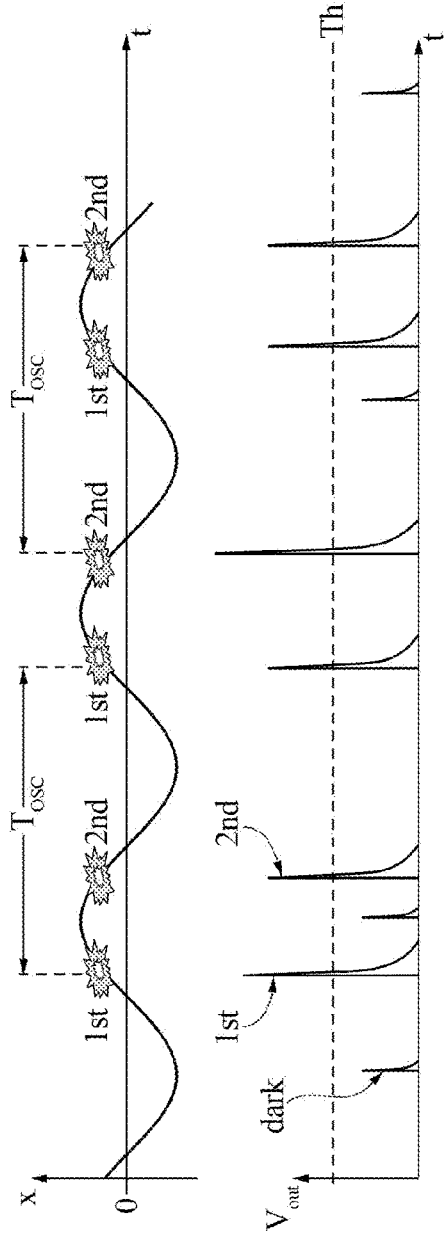
FIG. 6A
FIG. 6B
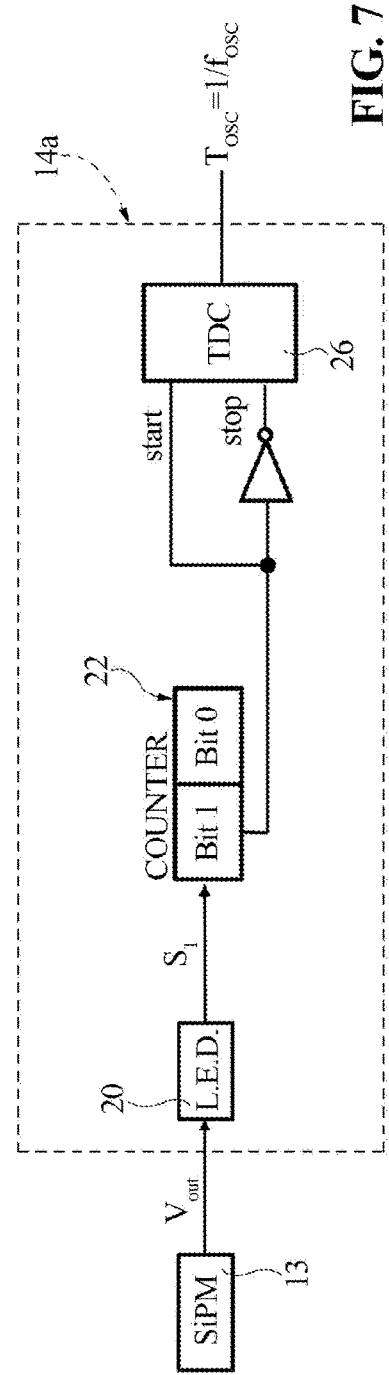
FIG. 7

OSCILLATION FREQUENCY MEASURING SYSTEM AND METHOD FOR A MEMS SENSOR

BACKGROUND

Technical Field

The present disclosure relates to a system and to a corresponding method for measuring the oscillation frequency of an oscillating element in a MEMS (Micro-Electro-Mechanical System) sensor.

Description of the Related Art

As is known, several MEMS sensors include mobile elements, which, during operation, undergo oscillating movements.

For example, known MEMS accelerometers, gyroscopes and microphones include mobile elements (e.g., in the form of beams or cantilevers suspended via a spring arrangement), which may vibrate at an oscillation frequency.

In particular, a passive vibration motion of a mobile element may be generated by an external acceleration (e.g., a shock), and properties of this vibration motion may be studied to measure the external acceleration or other physical properties of the external environment.

An active vibration of the mobile element may also be generated and maintained, by means of external electrical impulses, so as to detect other physical properties, e.g., a rotation due to the Coriolis principle (e.g., in a gyroscope), or a modification of the resonance frequency (e.g., in a resonant accelerometer).

The oscillating frequency of the mobile element may also change according to the chemical composition, pressure and density of a surrounding environmental medium; accordingly, properties of the oscillating motion may also be used in order to detect chemical parameters of the surrounding medium.

Effective use of a measure of the oscillating frequency of the mobile element is however difficult to implement, since a very fast and sensitive measuring system is used in order to measure the very high values of the same oscillating frequency.

For example, a capacitive coupling scheme has been proposed in known MEMS sensors, between the mobile element (usually denoted as "rotor" element) and one or more corresponding fixed elements (usually denoted as "stator" elements). The electrical signal, indicative of the capacitive variation, is detected and processed to measure the oscillating frequency.

However, this solution does not prove to be completely satisfactory, in terms of its response time and sensitivity.

BRIEF SUMMARY

The present disclosure is directed to a device that includes a MEMS sensor including at least a movable element configured to oscillate at an oscillation frequency and an integrated measuring system coupled to the movable element and configured to provide a measure of the oscillation frequency. The measuring system includes a light source configured to emit a light beam towards the movable element and a light detector configured to receive the light beam reflected back from the movable element, the light detector including a semiconductor photodiode array.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 6a, 6b show plots of analog signals related to oscillation frequency measurement in the MEMS sensor;

FIG. 7 shows a block diagram of a digital detection circuit in the MEMS sensor;

DETAILED DESCRIPTION

Figure 1:
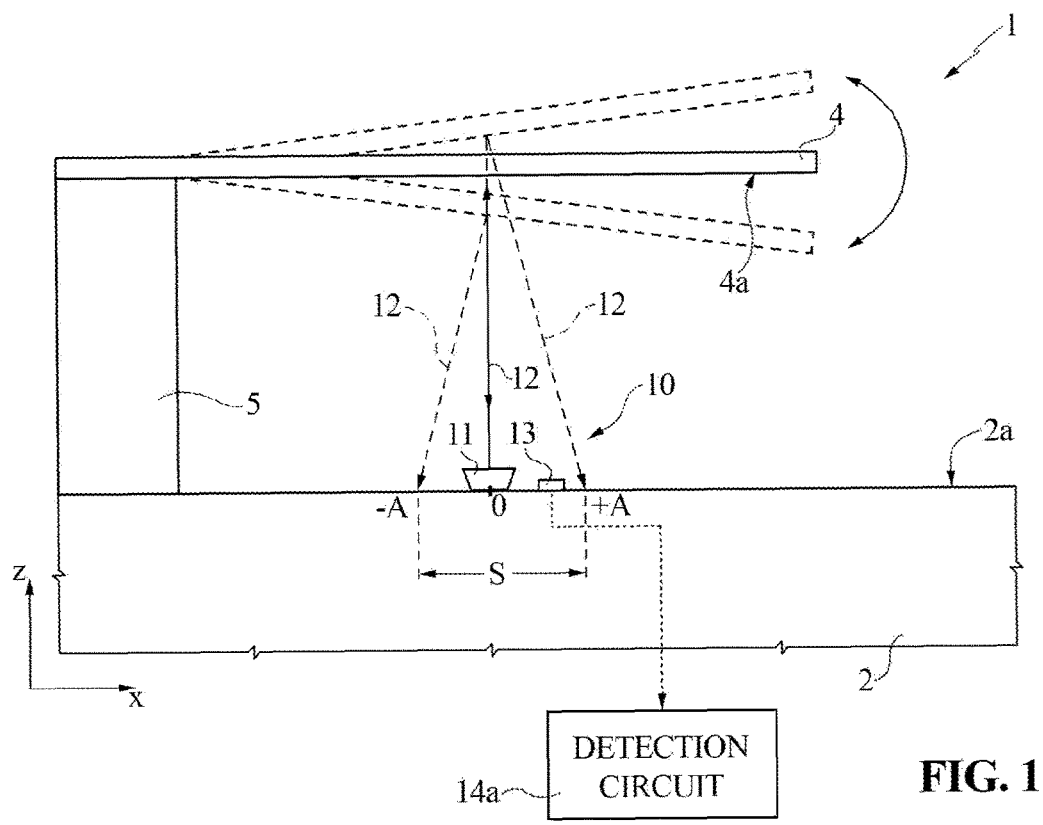
FIG. 1 is a schematic cross-sectional view of a MEMS sensor, with an oscillation frequency measuring system, according to an embodiment of the present solution.

FIG. 1 schematically shows a portion of a MEMS sensor 1, e.g., an accelerometer, a gyroscope or a microphone sensor (only the portion relevant to the disclosure of the present solution is shown and discussed in detail herein, while the general structure of the MEMS sensor 1 may be of any known type).

MEMS sensor 1 includes: a body 2 including semiconductor material, e.g., silicon, having a front surface 2a; and a movable element 4, e.g., a beam or a cantilever, suspended above the front surface 2a of the body 2, by means of a suspension structure 5, e.g., in the form of a vertical pillar, extending along a vertical direction z from the same movable element 4 to the front surface 2a of the body 2 (to which it is attached via suitable means).

Movable element 4 is designed to undergo an oscillating motion at an oscillation frequency (e.g., at its resonant frequency), and is part of a detection structure (denoted as 14b in FIG. 2), generally configured to detect a physical quantity of interest, e.g., a linear or angular acceleration, a pressure, a chemical quantity. The frequency of oscillation of the movable element 4 may be e.g., in the range from 2 kHz to 4 MHz.

MEMS sensor 1 further includes an oscillation-frequency measuring system 10, coupled to the body 2, in particular integrated within the body 2, and configured to carry out an optical measure of the oscillation frequency of the movable element 4.

Measuring system 10 includes: a light source 11, configured to generate a light beam 12, in particular a collimated light beam; and a light detector 13, arranged and configured to detect the light beam 12, after it has been reflected back from the movable element 4 during its oscillation. In particular, light beam 12 is reflected by a facing surface 4a of the movable element 4, facing the front surface 2a of the body 2. Light source 11 may include e.g., a LED (Light Emitting Diode), including a forward-biased P-N semiconductor junction. Moreover, biasing may be in continuous or gated mode (the latter option allowing to reduce the emitted power and related environment noise).

Light source 11 and light detector 13 are conveniently arranged side-by-side along an horizontal axis x lying in the plane of the front surface 2a, in particular being integrated into the same body 2 (as will be discussed in detail in the following).

Figure 2:
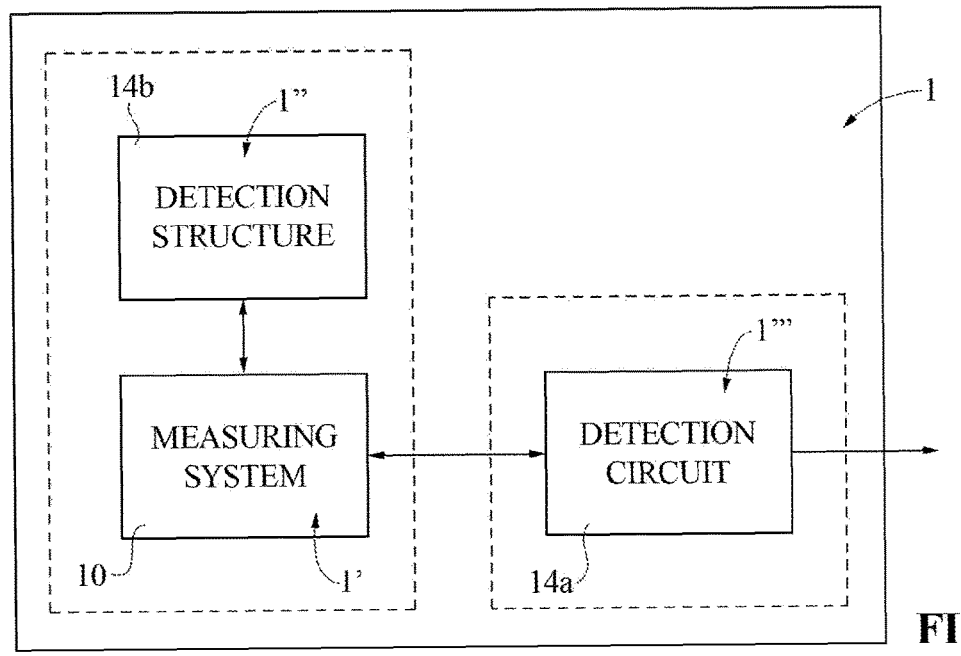
FIG. 2 is a schematic block diagram of the MEMS sensor.

As schematically shown in FIG. 2, light source 11 and light detector 13 of the measuring system 10 may be integrated in a same first die 1' of semiconductor material (including the body 2), and the movable element 4 (and any remaining parts of the detection structure 14b of the MEMS sensor 1) may be integrated in the same first die 1' or in a second die 1'' of semiconductor material, which is coupled to the first die 1'.

Measuring system 10 moreover is coupled to a detection circuit 14a, operatively coupled to the light detector 13, in order to provide a measure of the oscillation frequency.

Detection circuit 14a is conveniently provided as an ASIC (Application Specific Integrated Circuit), and is typically integrated in a third die 1''' of semiconductor material, which may be housed within a same package with the assembly of the first and second dice 1', 1'', where detection structure 14b of the MEMS sensor 1 and the light source 11 and light detector 13 are integrated. The same ASIC may integrate further electronic circuitry, e.g., control circuitry for biasing of the light source 11 and light detector 13, or further processing circuitry.

According to an aspect of the present embodiment, light detector 13 allows for single-photon detection operation (thus allowing to achieve a high sensitivity), and has a fast response time, with a detection frequency higher than 20 MHz.

In particular, light detector 13 includes a SiPM (Silicon Photo-Multiplier), that is suitably integrated within body 2.

Figure 3:
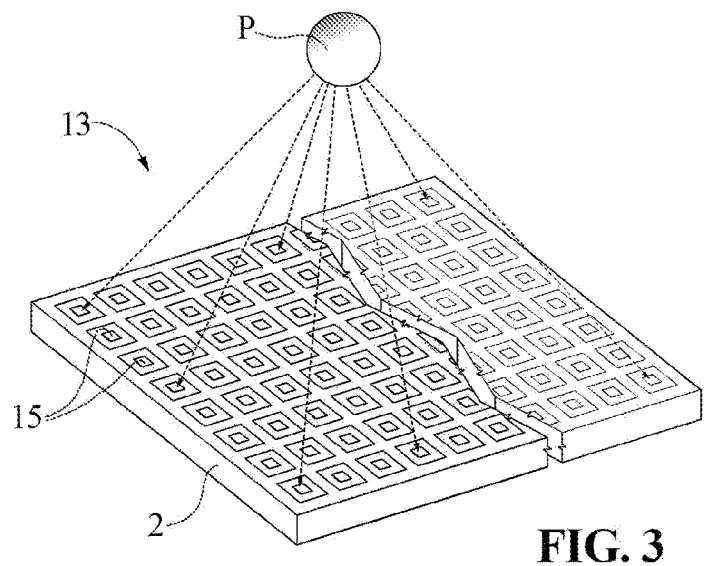
FIG. 3 is a schematic view of a photodiode array in the MEMS sensor of FIG. 1.

As it is known, and as schematically depicted in FIG. 3, a SiPM structure is based on an array of photodiode pixels or cells 15; in particular photodiodes are SPADs (Single Photon Avalanche Diode), working in single-pulse detection condition.

Figure 4:
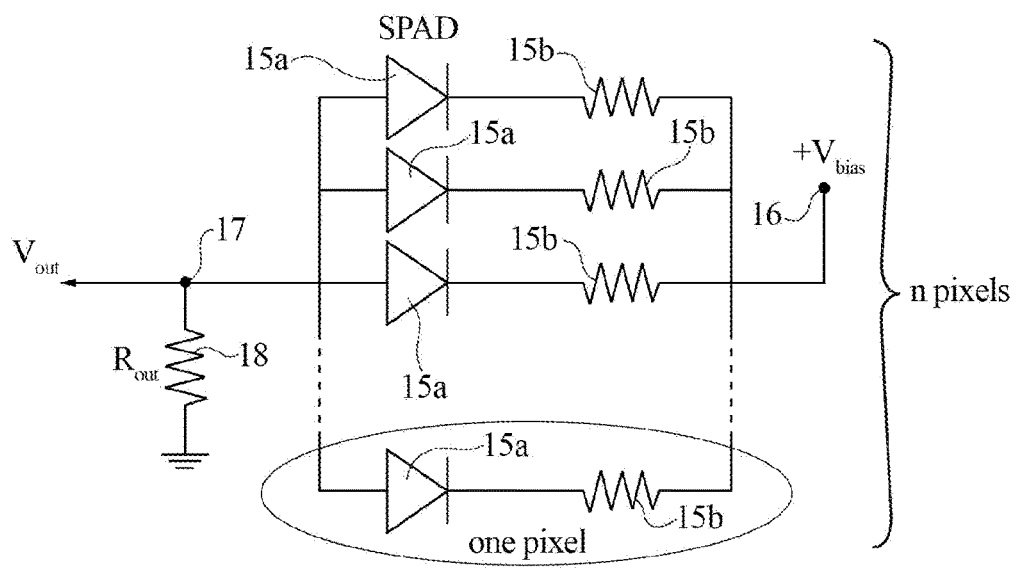
FIG. 4 is a schematic equivalent circuit of the photodiode array of FIG. 3.

As shown in the equivalent circuit of FIG. 4, each cell 15 includes a SPAD 15a, series-connected to an integrated decoupling quenching resistor 15b; the cells 15 are parallel connected between a biasing terminal 16, on which a biasing voltage $V_{bias}$ is provided, and an output terminal 17, on which a load 18 is applied (schematically represented as a resistor $R_{out}$). An output signal $V_{out}$ is provided on the output terminal 17.

Every SPAD in the SiPM structure operates as an independent photon counter, i.e., in the so called "Geiger mode", and provides a same signal when fired by a photon (denoted schematically with P in FIG. 3).

In particular, in the Geiger mode of operation, photodiodes are biased at a reverse-biasing voltage, having an absolute value higher than their breakdown voltage; due to the high electrical field in the depletion layer, a primary charge carrier thermally or photo-generated, may trigger an avalanche event and a sharp current pulse with sub-nanosecond rise time and a few mA peak value is generated.

Since all the cells 15 have a common load 18, the amount of charge collected at the output terminal 17 is given by the analog superposition of the signals generated by all the fired cells 15.

Figure 5A:
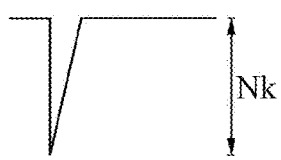
FIGS. 5a, 5b show plots of output signals from the photodiode array of FIG. 3, in different operating conditions.
Figure 5B:
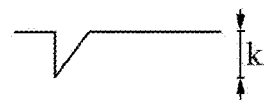

It is thus easy to distinguish the signal generated by many cells 15 simultaneously fired, from a so called "dark signal" produced by a single fired cell 15 due to dark noise, thanks to the quite different signal amplitudes (as shown by the comparison of FIG. 5a, depicting the output signal $V_{out}$ in case of N activated cells 15, having amplitude Nk; and FIG. 5b, depicting the output signal $V_{out}$ in case of a single activated cell 15, having amplitude k).

In general, the lower the number of cells 15, the lower the recharging time and thus the faster the timing response of the detection structure 14b.

Integration of the quenching resistors 15b with SPADs 15a allows to reduce the parasitic capacitances and to obtain recharging times in the range from a few nanoseconds to a few tens of nanoseconds, thus making SPADs available to detect pulsed signals with a rate higher than 10 MHz in single-photon detection mode.

Referring again to FIG. 1 and also to FIGS. 6a and 6b, the operating principle of the measuring system 10 will now be discussed.

During oscillation of the movable element 4, the light beam 12 is reflected towards the front surface 2a of the body 2 within a scanning range S along horizontal axis x (lying in the same front surface 2a), comprised between limit positions −A and +A (considering the position of light source 11 as the origin O along the x axis).

The projection of the light beam 12 along the x axis, shown in FIG. 6a, thus has a substantially sinusoidal trend with time, at the oscillation frequency $f_{osc}$, at least for small deflection range, around the origin O (extending and shifting the scanning range, the projection may become non-linear, without this however affecting the determination of the oscillation frequency $f_{osc}$, made as discussed in detail below).

In particular, during each oscillation period $T_{osc}$, the light beam 12 impinges twice on the SiPM of light detector 13, each time generating a "strobe", i.e., an amplitude peak or impulse in the output signal $V_{out}$ generated at output of the same SiPM, which is shown in FIG. 6b.

Each amplitude peak is due to the simultaneous firing of a number of cells 15, and it is clearly distinguished from lower amplitude peaks in the output signals, which may be due to "dark noise". In particular, a discrimination threshold Th may be easily identified, allowing to discriminate the amplitude peaks due to detection of the reflected light beam 12 by the light detector 13, from noise-generated events.

It is thus possible to measure the oscillation period $T_{osc}$ as the time interval between every two consecutive first (or second) strobes, or peaks, in the amplitude pattern of the output signal $V_{out}$ generated by the SiPM in light detector 13. The oscillation frequency $f_{osc}$ corresponds to the inverse of the measured oscillation period $T_{osc}$.

FIG. 7 shows a possible digital implementation of the detection circuit 14a, configured to provide a measure of the oscillation frequency $f_{osc}$, based on the above discussed operating principle, and in particular based on processing of the output signal $V_{out}$ generated by light detector 13.

Figure 8:
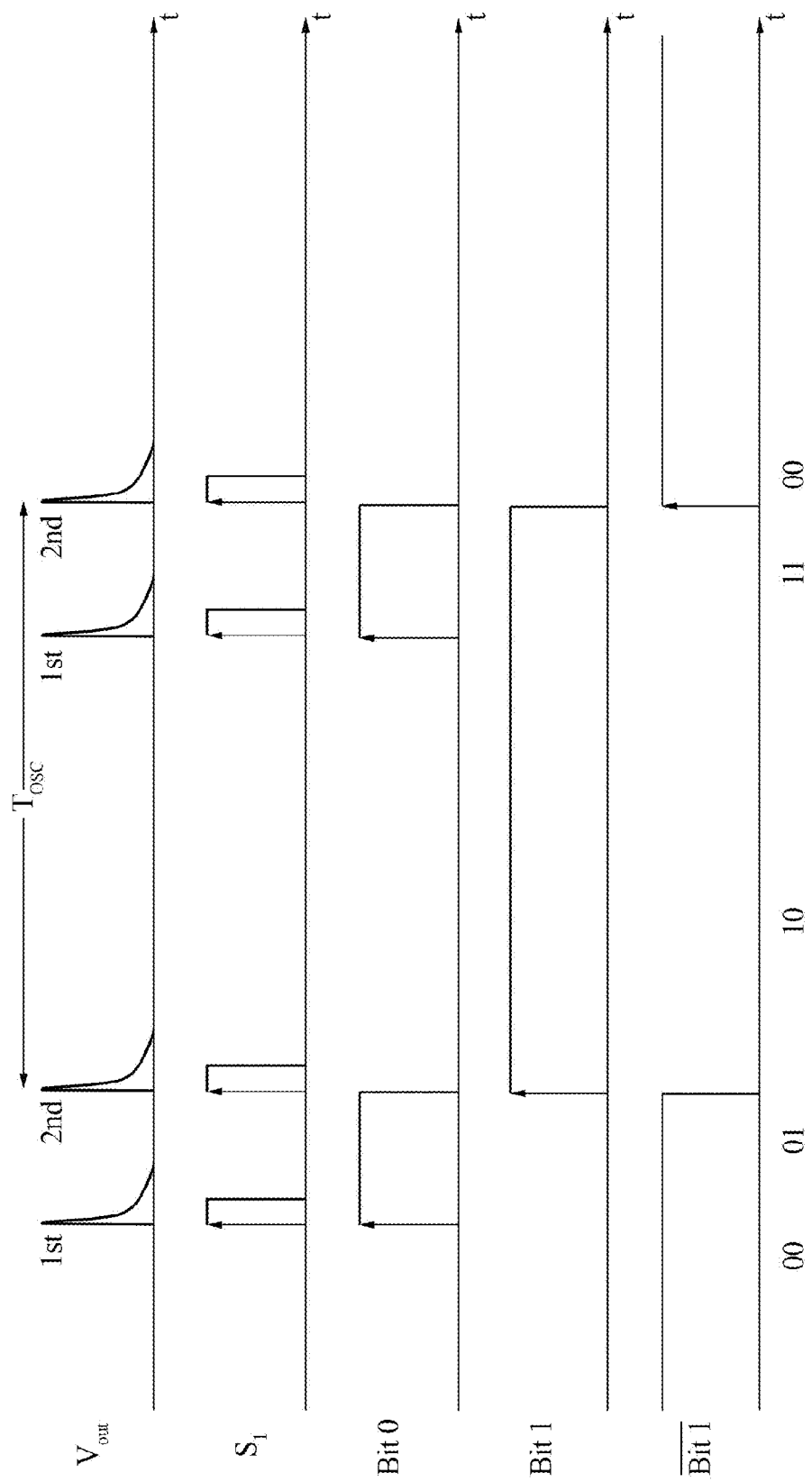
FIG. 8 shows plots of digital signals in the detection circuit of FIG. 7.

In detail, and with reference also to FIG. 8, detection circuit 14a is configured to receive the output signal $V_{out}$ from light detector 13 and includes:

a discriminating unit 20, in particular a Leading Edge Discriminator (L.E.D.), which receives the output signal $V_{out}$ and provides a first processed signal $S_1$, including a number of pulses, having a rectangular shape, each corresponding to a strobe in the output signal $V_{out}$, having an amplitude higher than the discrimination threshold Th;

a digital counter 22, in particular a two-bit asynchronous counter, having a count input receiving the first processed signal $S_1$, and providing at the output a two-bit count, including a first-bit digital signal "bit 0" and a second-bit digital signal "bit 1"; and a TDC (Time to Digital Converter) module 26, cascaded to the digital counter 22, and having a start-count input receiving the second-bit digital signal "bit 1", and a stop-count input receiving the complementary of the same second-bit digital signal "bit 1".

As shown in FIG. 8, first-bit digital signal "bit 0" is of the pulse type, having an ON interval (i.e., the interval where the signal is at the high logic level) between the leading edges of two consecutive pulses of the first processed signal $S_1$; and second-bit digital signal "bit 1", also of the pulse type, has an ON interval (i.e., an interval where the signal is at the high logic level) between the falling edges of two consecutive pulses of the first-bit digital signal "bit 0". Accordingly, TDC module 26 measures the time interval between two consecutive second peaks in the output signal $V_{out}$.

TDC module 26 thus provides at its output a measure of the oscillation period $T_{osc}$, for further processing, in particular for determination of the value of the oscillation frequency $f_{osc}$ as the inverse of the same oscillation period $T_{osc}$.

This determination may be made within the same ASIC of detection circuit 14a, or by an external processing unit (e.g., the microprocessor unit of an electronic apparatus where the MEMS sensor 1 is incorporated, here not shown).

Figure 9:
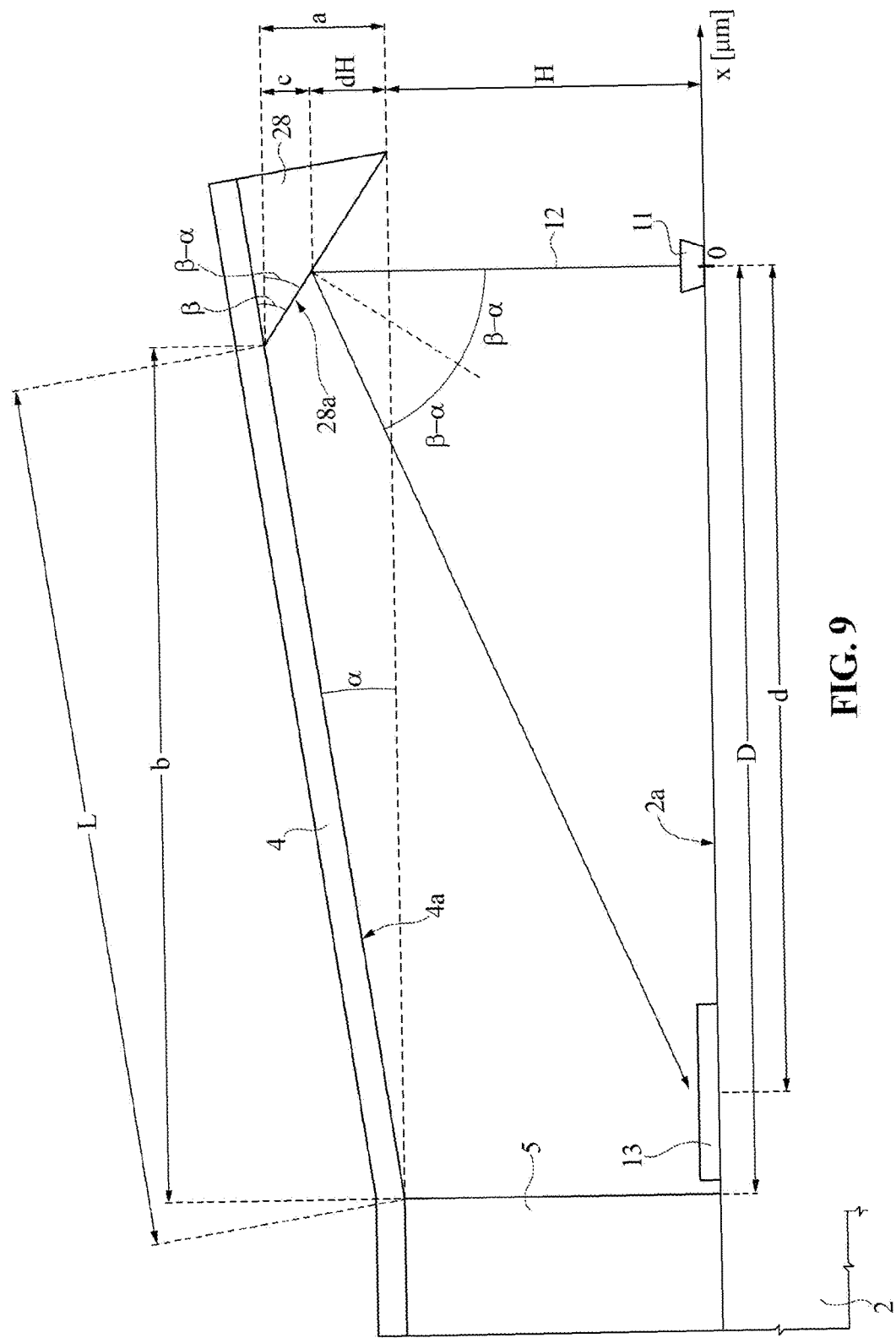
FIG. 9 shows a schematic cross-sectional views of a particular embodiment of a movable element in the MEMS sensor.

In a possible embodiment, shown in FIG. 9, the movable element 4 of measuring system 10 has a main portion having the facing surface 4a, and is provided with a tip portion 28, extending from the facing surface 4a towards the front surface 2a of the body 2; tip portion 28 is suitably designed to reflect the light beam 12 at a wider scanning range S.

This embodiment allows more spacing to be achieved for placement of the light detector 13, and is thus advantageous for an easier design of the measuring system 10.

The tip portion 28, which is wedge-shaped (or triangular in a cross-section transverse to the plane of the front surface 2a of the body 2), has an inclined light reflecting surface 28a, designed to reflect the light beam 12 generated by light source 11.

The light reflecting surface 28a is inclined at an inclination angle β with respect to the facing surface 4a of the main portion of the movable element 4, which in turn lies at a deflection angle α with respect to the x axis, due to the oscillating movement of the same movable element 4.

It may be shown that, during operation, a force of about $10^{-4}$ N acting on the movable element 4 is able to generate deflection angles α in the range of 5°-12° (common dimensions have been considered for the movable element 4).

Using geometrical relations, which will be evident from the examination of FIG. 9, the distance d from the origin O of the point where the reflected light beam 12 reaches the front surface 2a of the body 2 is given by the following expression:

$$d=(H+dH)\cdot\tan(2\cdot(\beta-\alpha))$$

where (H+dH) is the distance along the vertical direction z of the point where the light beam 12 contacts the light reflecting surface 28a of the tip portion 28 of the movable element 4 with respect to the front surface 2a of the body 2 (H being a fixed distance in a condition at rest between the facing surface 4a of the movable element 4 and the front surface 2a of the body 2, and dH being a variable distance depending on the oscillation movement of the same movable element 4).

Moreover, the following further expressions apply:

$$dH=a-c$$

$$c=(D-b)\cdot\tan(\beta-\alpha)$$

$$a=L\cdot\sin(\alpha)$$

$$b=L\cdot\cos(\alpha)$$

where D is the distance along the x axis between the position of the light source 11 and that of the suspension structure 5, and L is the length of the body portion of the movable element 4 (i.e., without considering the tip portion 28 thereof).

Figure 10A:
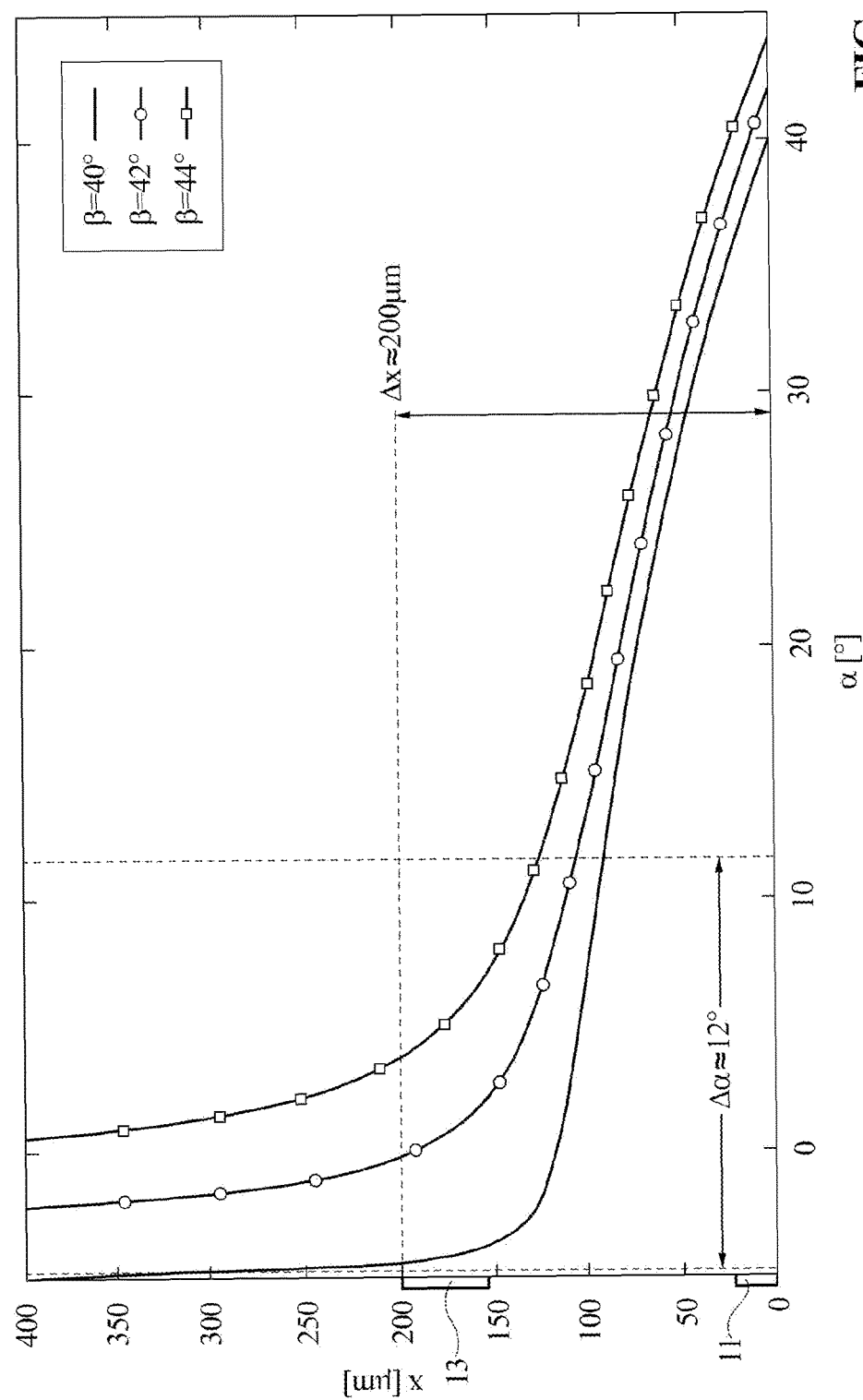
FIGS. 10a-10b show plots relating to dimensioning of the MEMS sensor of FIG. 9.

FIG. 10a shows the plot of the above expression for distance d, as a function of the deflection angle α, considering three different values for the inclination angle β: 40°, 42° and 44°. Moreover, the following values are considered: L=200 μm; D=205 μm; and H=25 μm.

Figure 10B:
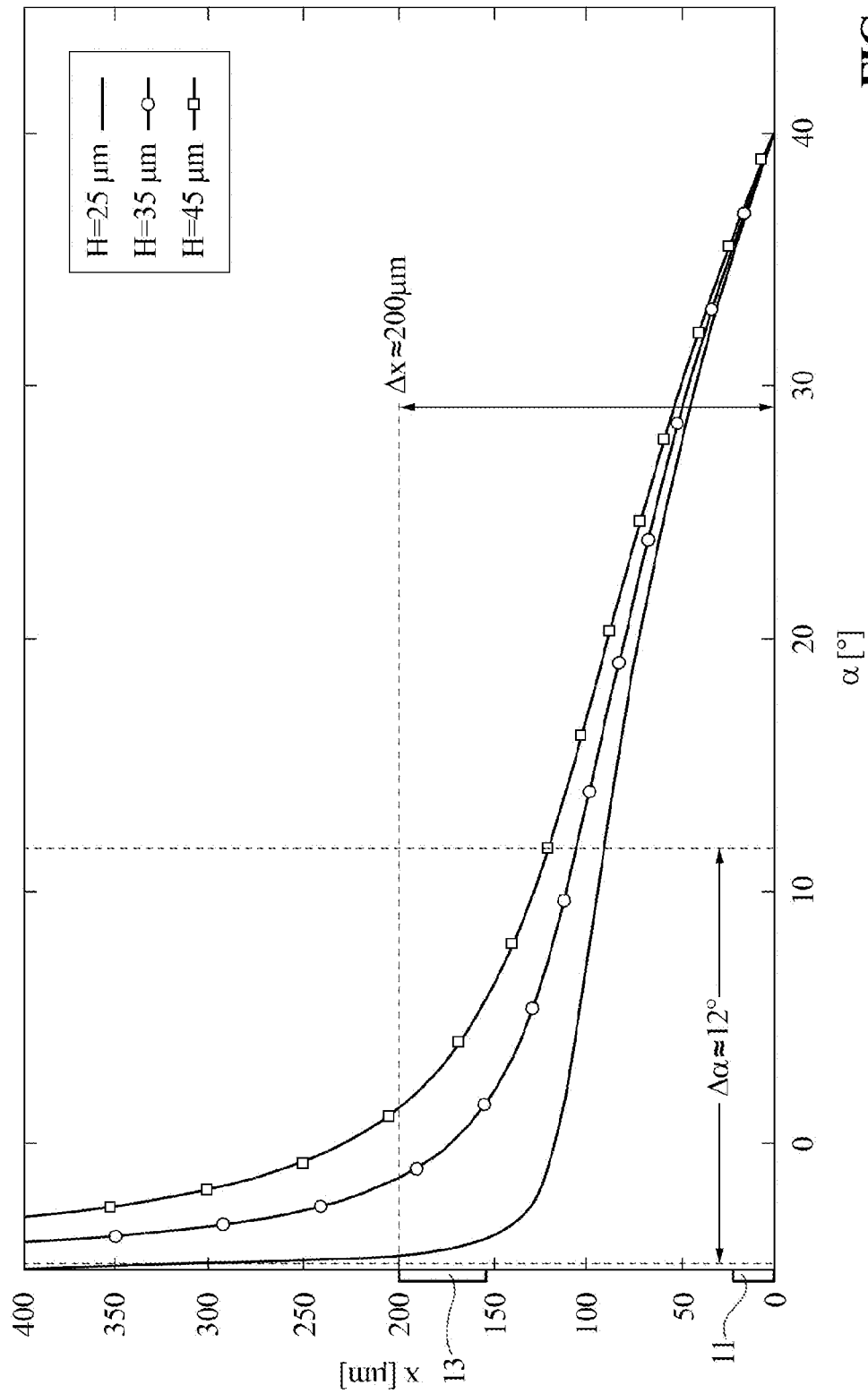

FIG. 10b shows the plot of the above expression for distance d, again as a function of the deflection angle α, this time considering three different values for distance H: 25 μm, 35 μm and 45 μm. Moreover, the following values are considered: L=200 μm; D=205 μm; and β=40°.

Considering a range of 12° for the deflection angle α, the above plots show that the above discussed arrangement and conformation of the measuring system 10 allows for a convenient placement of the light detector 13 with respect to the light source 11, in such a manner as to be able to receive the reflected light beam 12. Light detector 13 is arranged within the space allowed along the x axis, between the origin O and the suspension structure 5, in this case of about 200 μm (denoted as Δx in FIGS. 10a-10b).

In particular, with the light source having e.g., a size of 10-20 μm along the x axis, the SiPM of the light detector 13 may have a size ranging e.g., from 50×50 μm to 100×100 μm in a plane parallel to the front surface 2a of the body 2, large enough to design an array of 2×2 or 3×3 cells 15.

An exemplary embodiment of a manufacturing process of the MEMS sensor 1, with particular regard to measuring system 10, is now disclosed.

Figure 11A:
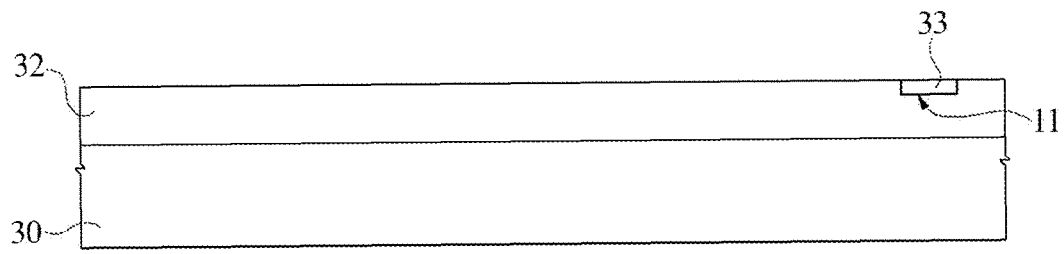
FIGS. 11a-11f show schematic cross-sections of a body of semiconductor material in consecutive steps of a manufacturing process for manufacturing the measuring system of the MEMS sensor.

In a first step, FIG. 11a, a substrate 30 is provided, made of semiconductor material, in particular silicon; a first structural layer 32, e.g., an epitaxial layer, is formed on the substrate 30 (as an alternative, first structural layer 32 may be a multi-layered structure of composite materials).

The light source 11 is then formed within the first structural layer 32; in the case where light source 11 includes a LED, a semiconductor junction is formed, via formation of at least a first doped region 33 within a surface portion of the first structural layer 32 (the first doped region 33 having a different doping type with respect to the first structural layer 32).

Figure 11B:
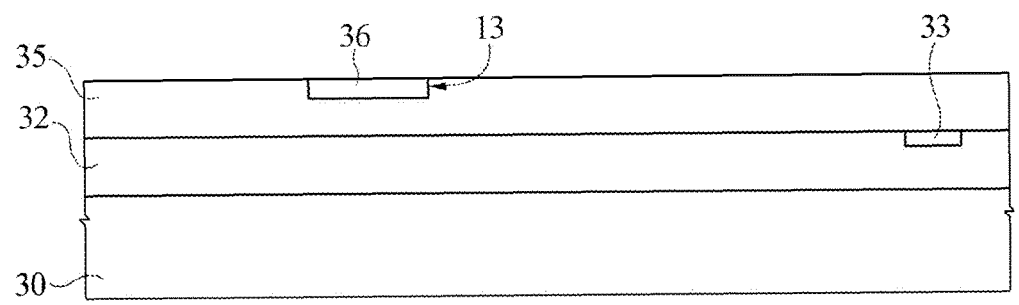

In a subsequent step, FIG. 11b, a second structural layer 35, e.g., an epitaxial layer (or a multi-layered structure of composite materials), is formed on the first structural layer 32, and the light detector 13 is then formed within the same second structural layer 35; in the case where the light detector 13 includes a SiPM, a number of further doped regions 36 (only one of which is schematically shown in FIG. 11b), arranged to form the array of cells 15 (each including a SPAD), are formed within a surface portion of the second structural layer 35.

Figure 11C:
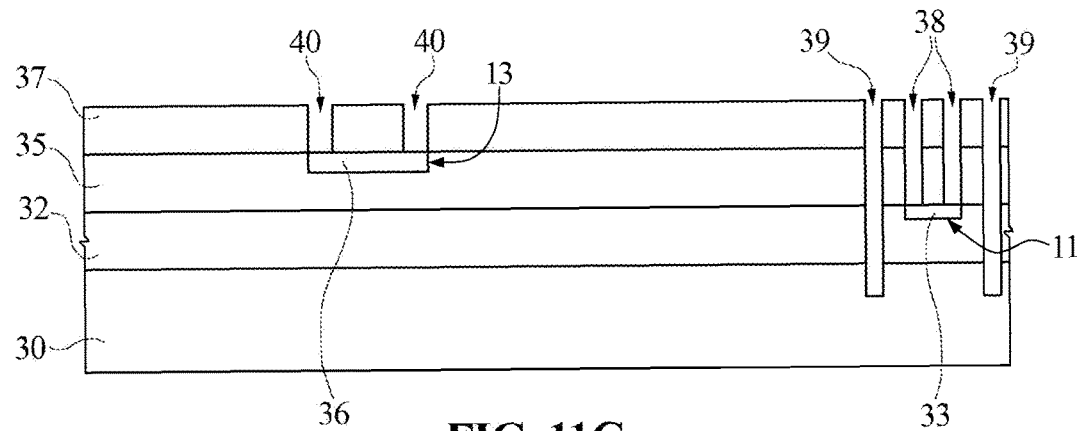

Afterwards, FIG. 11c, a thick insulating layer 37, e.g., of silicon oxide, is formed on the second structural layer 35, and is then subjected to three different photolithographic etching operations:

a first etching operation with a first masking layer (not shown), for removal of portions of the thick insulating layer 37 and second structural layer 35, to form first trenches 38, designed for contacting the light source 11;

a second etching operation with a second masking layer (not shown), for removal of portions of the thick insulating layer 37, second structural layer 35 and first structural layer 32, to form second trenches 39, designed for insulating the light source 11 from the light detector 13 (second trenches 39 advantageously form a closed confinement structure around the light source 11, e.g., with a ring section parallel to the main surface of substrate 30); and a third etching operation with a third masking layer (not shown), for removal of portions of the thick insulating layer 37, to form third trenches 40, designed for contacting the light detector 13.

Figure 11D:
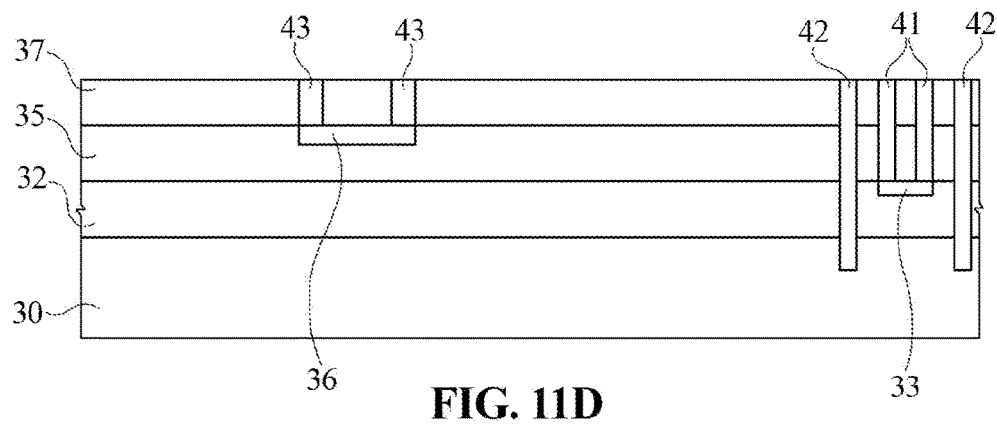

In a subsequent step, FIG. 11d, a metal deposition with etchback is performed, in order to fill the first, second and third trenches 38, 39, 40 with respective metal filling regions 41, 42, 43, e.g., of tungsten.

In particular, first and third metal filling regions 41, 43 provide electrical contact paths to the light source 11 and the light detector 13, respectively; while the second metal filling regions 42 defines a confinement structure to avoid direct illumination of the light detector 13 from photons directly emitted by the light source 11 (which are blocked by the same second metal filling regions 42, operating as an optical insulation material).

It is to be noted that the drawings are not to scale, and that the active area of the light source 11 is much smaller than the respective active area of the light detector 13, in order to reduce light cone emission.

Figure 11E:
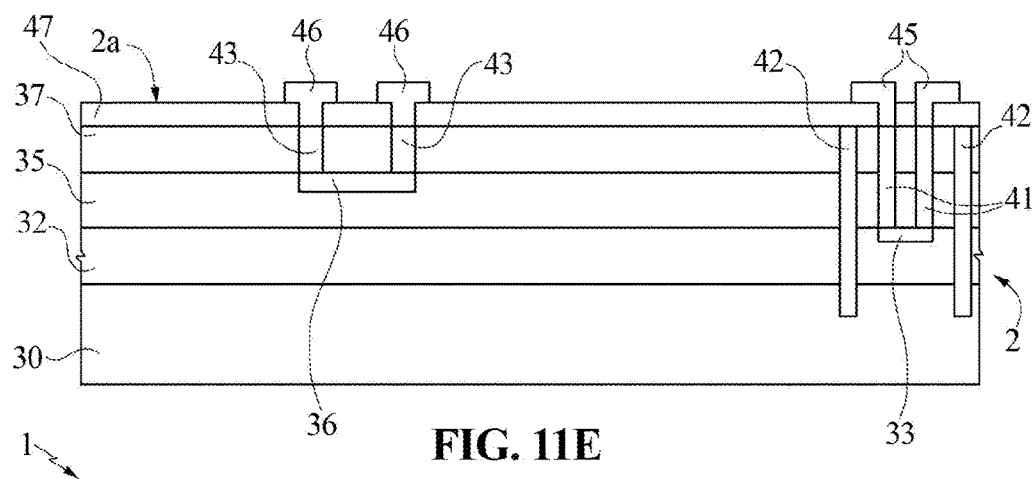

First and second electrical contacts 45, 46 are then formed, FIG. 11e, to electrically contact the first and third metal filling regions 41, 43 and thus the light source 11 and light detector 13, in order to allow biasing thereof (at a forward biasing voltage, and, respectively, at a high reverse biasing voltage) and detection of the output signals; in particular, a further insulating layer 47 is formed on the thick insulating layer 37, e.g., of TEOS, which is then planarized, and a metallization operation is performed.

The body 2 where the measuring system 10 is integrated is thus formed, with the first and second electrical contacts 45, 46 arranged at the front surface 2a.

Figure 11F:
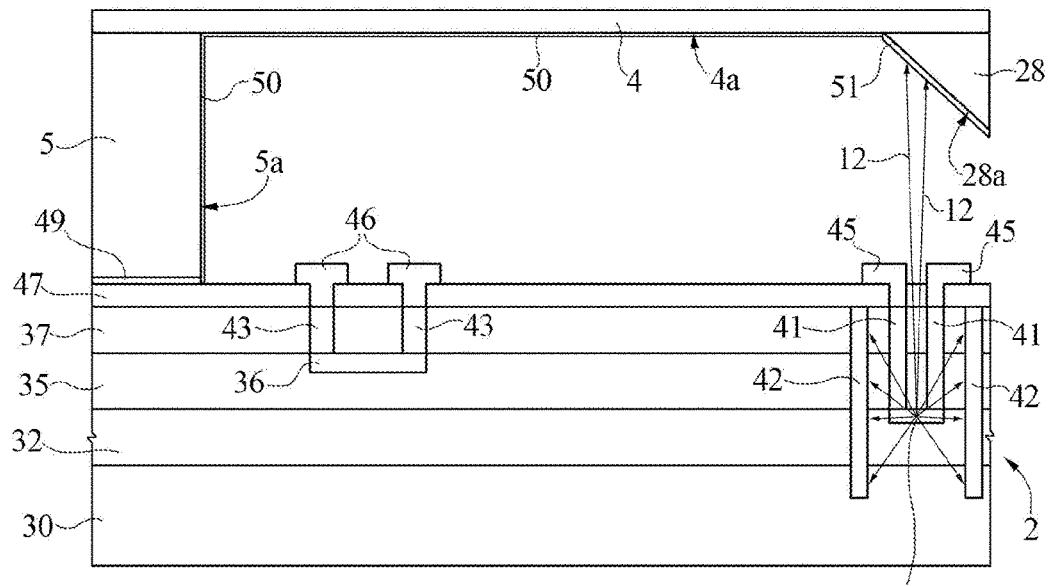

A final step of the manufacturing process, FIG. 11f, envisages coupling the detection structure 14b of the MEMS sensor 1 (integrated in second die 1") to the body 2, via a die-attaching operation, and interposition of an adhesive layer 49.

In particular, the movable element 4 is arranged so as to face the front surface 2a of the body 2 and light source 11 and light detector 13.

The facing surface 4a of the movable element 4 facing the front surface 2a of the body 2, as well as internal surface 5a of the suspensions structure 5 may be partially coated with a suitable light absorbing layer 50, e.g., of TiN.

Moreover, the light-reflecting surface 28a of the tip 28 may be coated of a reflecting layer 51 of any suitable reflecting material, e.g., of glass, in order to enhance reflectivity to light beams 12.

It is to be noted that the probability to have the SiPM in the light detector 13 triggered by photons directly emitted by the light source 11 is remarkably reduced by the optical trench between emitter and detector, defined by the above discussed confinement structure.

The double trench arrangement all around the light source 11 further reduces light cone emission, making almost collimated the light emitted by the same light source 11 and reflected back by the movable element 4.

As previously discussed, in a possible embodiment, LED in the light source 11 is operated using forward bias in a continuous emission light regime; SiPM is operated in reverse condition at a bias higher than its breakdown voltage. The quenching resistors 15b in the cells 15 of SiPM quench the avalanche current in the fired pixels in a time in the range from a few nanoseconds to a few tens of nanoseconds, thus making them available to detect pulsed signals with a rate higher than 10 MHz in single-photon detection mode, even for low sensitivity incident photon fluxes.

Figure 12:
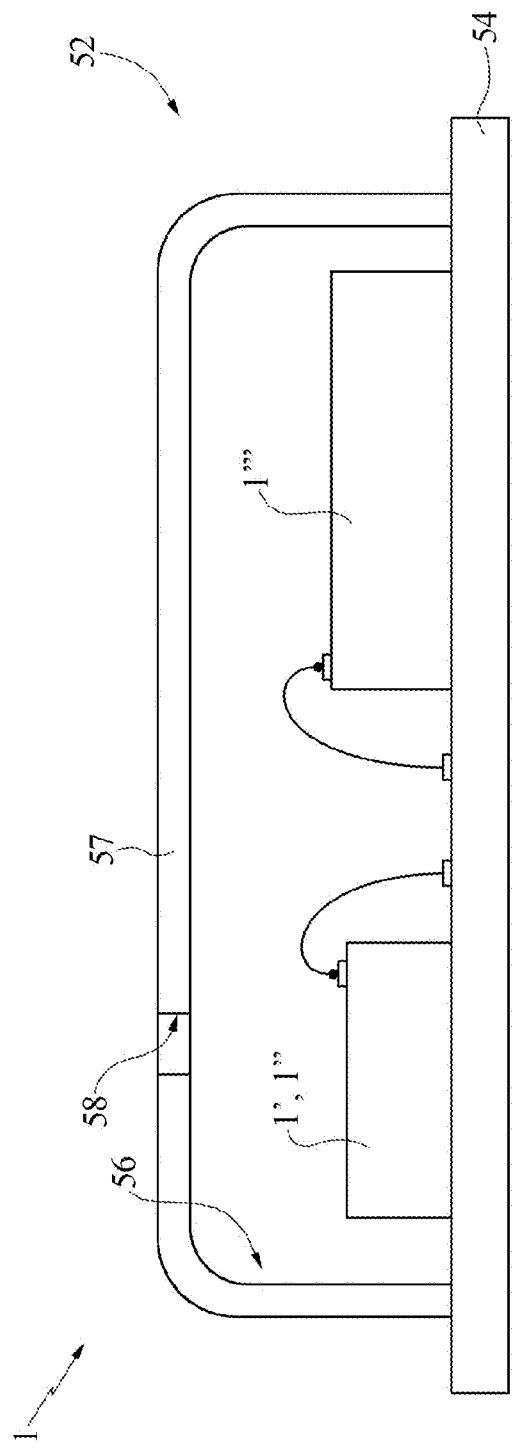
FIG. 12 is a schematic cross-section of a package of the MEMS sensor.

FIG. 12 shows an exemplary package 52 for MEMS sensor 1.

Package 52 includes a base substrate 54; the assembly of the first and second dice 1', 1" integrating the detection structure 14b and measuring system 10 of the MEMS sensor 1, and also the third die 1'" of the ASIC circuit 14a are arranged side by side on the base substrate 54.

A molding compound (not shown) may cover the base substrate 54 and the third die 1", a cavity 56 is in any case defined over the assembly of the first and second dice 1', 1".

Moreover, a covering layer 57 is provided, to close at the top the cavity 56; an opening 58 may be provided through the covering layer 57, in order to access the cavity 56 from the outside environment (e.g., to allow entry of sound pressure waves).

The advantages of the solution described are clear from the foregoing discussion.

In any case, it is again emphasized that an optical measuring system 10 is integrated within a MEMS sensor 1, to provide an optical measure of the oscillation frequency $f_{osc}$ of a related movable element 4.

The oscillation frequency measure may be used for a number of purposes, e.g., for measuring a linear or angular acceleration, a pressure, a chemical composition of a medium, etc. In other words, using only one detection structure and the resulting oscillation frequency measure (after being suitably processed), it is possible to obtain measures of various mechanical and chemical quantities of interest.

The discussed solution guarantees a compact and low cost solution for detection of the oscillation frequency $f_{osc}$.

Moreover, the use of Geiger-mode single-photon detection operation allows a very accurate measurement of oscillation frequencies higher than tens of MHz, thanks to the fast timing response of the detector.

Finally, it is clear that modifications and variations may be made to what is described and illustrated herein, without thereby departing from the scope of the present disclosure.

In particular, the arrangement and conformation of the measuring system 10 may be suitably modified in order to further increase the sensitivity of the optical measurement.

For example, the length L of the movable element 4 may be increased, in order to increase the distance available for light detection, even for smaller deflection angles α; the value of the inclination angle β may be as well modified according to the sizing requirements.

Use of a diverging lens coupled to the light detector 13 could also be envisaged, in order to further increase the sensitivity.

The discussed solution may be applied also in case the movable element 4 is a membrane or another kind of moving structure, and the conformation of the suspension structure 5 and the general structure of the detection structure 14b in MEMS sensor 1 may vary with respect to what has been schematically illustrated, by way of example.

Moreover, light source 11 may be of a different type, e.g., a diode laser or a VCSEL (Vertical Cavity Surface Emitting Laser); also, the array of cells 15 in the SiPM may be actively, instead of passively, quenched.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a MEMS sensor including:
      a substrate;
      a first structural layer on the substrate;
      a second structural layer on the first structural layer;
      an insulating layer on the second structural layer;
      a movable element coupled to the substrate and configured to oscillate at an oscillation frequency; and
      an integrated measuring system coupled to the movable element, the measuring system including:
         a light source in the first structural layer, the light source configured to emit a light beam towards the movable element;
         a light detector in the second structural layer, the light detector configured to receive the light beam reflected back from the movable element, the light detector including a semiconductor photodiode array; and
         an optical confinement region extending from a first surface of the insulating layer through the first and second structural layers and at least partially into the substrate, the confinement region at least partially surrounding the light source; and
   an electronic detection circuit, operatively coupled to the light detector and configured to provide a measure of the oscillation frequency based on an output signal received from said light detector.

2. The device according to claim 1 wherein the light detector is an integrated photomultiplier including an array of single-photon avalanche diodes.

3. The device according to claim 1 wherein the measuring system is integrated in a body including the substrate, the first structural layer, the second structural layer and the insulating layer, and the movable element is coupled to the body, suspended above a front surface of the body, the moveable element having a bottom surface that faces the front surface, the light beam being configured to hit the bottom surface of the moveable element and reflect back to the front surface.

4. The device according to claim 3, wherein the light source is optically confined within the body by the surrounding optical confinement region, separating the light source from the light detector within the body.

5. The device according to claim 1 wherein the output signal from the light detector includes at least one peak within each oscillation period corresponding to the detection of the reflected light beam, the electronic detection circuit further including a time measuring stage configured to receive the first processed signal and to measure a time interval occurring between corresponding peaks detected in consecutive oscillation periods.

6. The device according to claim 5 wherein the electronic detection circuit is provided as an ASIC integrated in a die including semiconductor material, coupled to the body within a same package.

7. The device according to claim 5 wherein the output signal has a first peak and a second peak within each oscillation period; and wherein the electronic detection circuit is of the digital type, and the time measuring stage includes a digital counter configured to measure the time interval between a pair of first, or second, peaks detected in two consecutive oscillation periods.

8. The device according to claim 5 wherein the electronic detection circuit is configured to provide a mechanical measure of motion of the device or a chemical measure related to a medium surrounding the device, based on the measure of the oscillation frequency.

9. The device according to claim 1 wherein the measuring system is integrated in a body including the substrate, the first structural layer, the second structural layer and the insulating layer, and the movable element has a main portion facing a front surface of the body with a facing surface; wherein the main portion carries a tip element having a light reflecting surface, inclined at an inclination angle with respect to the facing surface and arranged to reflect the light beam emitted from the light source towards the front surface of the body.

10. The device according to claim 9 wherein the movable element is suspended above the front surface of the body by a suspension structure, and the light detector is arranged, with respect to the front surface, in a region between the suspension structure and the light source; wherein the inclination angle has a value such that the light reflecting surface of the tip element reflects the light beam within said region.

11. The device according to claim 9 wherein the main portion of the movable element is at least in part covered with a light absorbing layer, and the light-reflecting surface of the tip is covered at least in part by a layer of reflecting material.

12. The device according to claim 1 wherein the light detector is an integrated photomultiplier including an array of single-photon avalanche diodes, and integrated passive quenching resistors coupled to respective single-photon avalanche diodes.

13. The device according to claim 1 wherein the light detector is an integrated photomultiplier including an array of single-photon avalanche diodes; wherein the single-photon avalanche diodes are configured to operate as independent photon counters, and are operatively coupled to a reverse-biasing voltage, the reverse-biasing voltage having an absolute value higher than a breakdown voltage of the single-photon avalanche diodes; and wherein the light source includes a forward-biased integrated light emitting diode.

14. A method, comprising:
   measuring an oscillation frequency of a movable element of a MEMS sensor, the movable element being configured to oscillate at an oscillation frequency, the measuring including:
      emitting a light beam towards the movable element by a light source that is formed in a first structural layer on a substrate and is at least partially surrounded by an optical confinement region that extends at least partially into the substrate and extends through the first structural layer, a second structural layer on the first structural layer and an insulating layer on the second structural layer;

reflecting the light by the movable element;

receiving, at a light detector including a semiconductor photodiode array formed in the second structural layer, the light beam reflected by the movable element;

generating, by the light detector, an output signal having a pattern with at least one peak within each oscillation period corresponding to the detection of the reflected light beam; and measuring the oscillation frequency based on the output signal.

15. The method according to claim 14 wherein measuring the oscillation frequency includes measuring a time interval occurring between peaks in the output signal within consecutive oscillation periods.

16. A MEMS sensor, comprising:
a body including:
a substrate;
a first structural layer on the substrate;
a light source in the first structural layer;
a second structural layer on the first structural layer;
a semiconductor photodiode array in the second structural layer;
an insulating layer on the second structural layer; and
an optical confinement region extending from a first surface of the insulating layer through the first and second structural layers and at least partially into the substrate, the confinement region at least partially surrounding the light source;
a movable element coupled to the body and configured to oscillate at an oscillation frequency; and
a measuring system integrated in the body, coupled to the movable element and configured to provide a measure of the oscillation frequency, the measuring system including:
the light source, the light source being configured to emit a light beam towards the movable element; and
the light detector, the light detector being configured to receive the light beam reflected back from the movable element, the light detector including a semiconductor photodiode array.

17. The MEMS sensor according to claim 16 wherein the movable element is suspended above a front surface of the body, the moveable element having a bottom surface that faces the front surface, the light beam being configured to hit the bottom surface of the moveable element and reflect back to the front surface.

18. The MEMS sensor according to claim 17, wherein the light source is optically confined within the body by the surrounding optical confinement region, separating the light source from the light detector within the body.

19. The MEMS sensor according to claim 16 wherein the movable element has a main portion facing a front surface of the body with a facing surface; wherein the main portion carries a tip element having a light reflecting surface, inclined at an inclination angle with respect to the facing surface and arranged to reflect the light beam emitted from the light source towards the front surface of the body.

20. The MEMS sensor according to claim 19 wherein the movable element is suspended above the front surface of the body by a suspension structure, and the light detector is arranged, with respect to the front surface, in a region comprised between the suspension structure and the light source; wherein the inclination angle has a value such that the light reflecting surface of the tip element reflects the light beam within said region.

* * * * *